(12) United States Patent
Choi

(10) Patent No.: US 6,272,053 B1
(45) Date of Patent: Aug. 7, 2001

(54) SEMICONDUCTOR DEVICE WITH COMMON PIN FOR ADDRESS AND DATA

(75) Inventor: Jin Hyeok Choi, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/283,736

(22) Filed: Apr. 2, 1999

(30) Foreign Application Priority Data

Apr. 3, 1998 (KR) .................................................. 98-11816

(51) Int. Cl.[7] .............................. G06F 12/00; G11C 7/00; G11C 8/00
(52) U.S. Cl. ............................. 365/189.03; 365/189.02; 365/189.05; 365/191; 365/194; 365/230.02; 711/211; 711/154
(58) Field of Search .................................. 711/104, 154, 711/211; 365/189.02, 189.03, 230.02, 189.05, 191, 194

(56) References Cited

U.S. PATENT DOCUMENTS

| | | | |
|---|---|---|---|
| 5,249,160 | * 9/1993 | Wu et al. | 365/230.08 |
| 5,640,361 | * 6/1997 | Hessel | 365/233 |
| 5,793,990 | * 8/1998 | Jirgal et al. | 395/287 |
| 5,845,108 | * 12/1998 | Yoo et al. | 395/551 |
| 6,044,412 | * 3/2000 | Evoy | 710/14 |

FOREIGN PATENT DOCUMENTS 07-21768    1/1995   (JP) .

\* cited by examiner

*Primary Examiner*—Hiep T. Nguyen
*Assistant Examiner*—Kimberly McLean
(74) *Attorney, Agent, or Firm*—Jacobson Holman, PLLC

(57) ABSTRACT

The present invention relates to a semiconductor memory device; and, more particular, to DRAM and SRAM having a common pin for address and data signals. A semiconductor memory circuit in accordance with the present invention has at least one common signal input terminal for receiving data signals and address signals, wherein the common signal input terminal is coupled to a plurality signal paths and a signal path selector for selecting one of the plurality signal paths in response to a write enable signal, a read enable and a control signal from a memory controller. The signal path selector has a plurality of buffers on the signal paths and the signal path selector selects one of the buffers in response to a write enable signal, a read enable and a control signal from a memory controller.

11 Claims, 7 Drawing Sheets

SEMICONDUCTOR DEVICE WITH COMMON PIN FOR ADDRESS AND DATA

FIELD OF THE INVENTION

The present invention relates to a semiconductor memory device; and, more particular, to DRAM (Dynamic Random Access Memory) and SRAM (Static Random Access Memory) having a common pin for address and data signals.

DESCRIPTION OF THE PRIOR ART

Generally, one of the remarkable features is for the SRAM device to be used as a memory device in the mobile telecommunications. The main issue associated with the SRAM device is put on the reduction of power and its package size. Since the mobile telecommunications have used a battery as a power supply, it is very important to implement the low power consumption in the used telecommunication equipment. Furthermore, with the miniaturization of the portable telephones, it is required to reduce the size of memory package as well as other elements.

Recently, the many efforts have been made for reducing the operation voltage in the SRAM device and also new packaging technology, such a CSP (Chip Scale Package), has been developed for decreasing the size of the package.

FIG. 1 is a block diagram illustrating package balls in the conventional 1M, 2M and 4M SRAM devices. As shown in FIG. 1, a SRAM package of the conventional CSP has 48(6×8) balls corresponding to the input/output pins and the distance between the balls is approximately 0.75 $\mu$m. However, with the increase of integration in the SRAM device, the conventional CSP may increase the size of the package because of a number of balls. That is, since it is inevitable that the chip in the conventional CSP should be enlarged more than the ball grid area, it is very difficult to minimize the chip size of devices with low cost in the production of the memory device.

Although the decrease of distance between the balls may solve such an integration problem, it is very difficult to reduce the distance between the balls because other problems can occur in the package. Particularly, the width between metal wires is limited to a predetermined distance in the PCB (Printed Circuit Board) of the portable telephones. In the case of a chip having 48 balls, the distance between the balls is limited to more than 0.75 $\mu$m for connecting all the balls to metal wires. Furthermore, the 48-ball CSP should be used only in 4M SRAMs or less because of the small number of ball. Accordingly, when 8M SRAM devices prevail in various applications in the future, a new standard for the CSP must be established.

FIG. 2a is a block diagram illustrating data input/output pad and address pad in the conventional SRAM and FIG. 2b is a timing chart illustrating a read cycle and a write cycle in FIG. 2a. Referring to FIGS. 2a and 2b, at a write operation in the conventional SRAM, data from a data input/output pad (I/O pad) are inputted into selected memory cells via an input buffer 20, which is controlled by a write enable signal /WE. At a read operation for reading out stored data in the memory cells, the output data are outputted to the data input/output pad through an output buffer 22, which is controlled by the write enable signal /WE and a read enable signal /OE. In similar, addresses from an address input pad are inputted into a decoder via an input buffer 24. In FIG. 2b, /CS denotes a chip enable signal. The signal transmission between an external circuit and an internal memory is carried out through the buffers in response to various control signals. Typically, the buffer exists on each of the signal paths.

Referring now to FIG. 2c showing the input and output buffers in FIG. 2a, the output buffer 20 includes a control part receiving the write and output control signals /WE and /OE and a CMOS inverter, and also the input buffers 22 and 24 include pull-up device and pull-down devices which perform a logic OR operation. The input buffer 22 connected to the I/O pad is controlled by the write enable signal /WE.

However, since this conventional memory device, such an SRAM, must have a separate pad for each of data and address signals, the number of pin may increase with the reduction of its integration. Furthermore, this increase in the number of pin simultaneously appears in other memory devices, such as SRAM, DRAM and ROM.

SUMMARY OF THE INVENTION

It is, therefore, an object of the present invention to provide a semiconductor memory device capable of decreasing the size of its package with the reduced number of pin.

In accordance with an aspect of the present invention, there is provided a signal processing device receiving signals from an external circuit and outputting processed signals to the external circuit, the signal processing device comprising: at least one common signal input means for receiving more than two kinds of signals; a plurality of signals paths connected to the common signal input means; and a control means for controlling the signals paths in response to a plurality of control signals from the external circuit.

In accordance with another aspect of the present invention, there is provided a semiconductor memory device comprising: at least one common signal input terminal for receiving data signals and address signals; a first input terminal for receiving a read enable signal; a second input terminal for receiving a write enable signal; a third input terminal for receiving a first control signal to control a signal transferring path according to kinds of signals on the common signal input terminal, wherein the signals on the common signal input terminal are the data signals or the address signals; a data input means coupled to the common signal input terminal for inputting the data signals to memory cells in response to the write enable signal and the first control signal; and an address input means coupled to the common signal input terminal for inputting the address signals to a decoding means in response to the write enable signal and the first control signal.

In accordance with still another aspect of the present invention, there is provided a semiconductor memory circuit comprising: at least one common signal input terminal for receiving data signals and address signals, wherein the common signal input terminal is coupled to a plurality signal paths; and a signal path selecting means for selecting one of the plurality signal paths in response to a write enable signal, a read enable and a control signal from a memory controller. The signal path selecting means comprises a plurality of buffers on the signal paths and the signal path selecting mean selects one of the buffers in response to a write enable signal, a read enable and a control signal from a memory controller. Also, the buffer further comprises a plurality of latch circuits and wherein the latched signals are selected by a chip enable signal, the write enable signal and the control signal from a memory controller.

BRIEF DESCRIPTION OF THE DRAWINGS

The above and other objects and features of the present invention will be become apparent from the following description of the preferred embodiments given in conjunction with the accompanying drawings, in which:

FIG. 2b is a timing chart illustrating a read cycle and a write cycle in FIG. 2a;

FIG. 2c is a block diagram illustrating detailed configuration of input and output buffers in FIG. 2a;

FIG. 3b is a timing chart illustrating a read cycle and a write cycle in FIG. 3a;

FIG. 3c is a block diagram illustrating detailed configuration of input and output buffers in FIG. 3a;

DETAILED DESCRIPTION OF THE PREFERRED EMBODIMENTS

Hereinafter, the present invention will be described in detail referring to the accompanying drawings.

Figure 1:
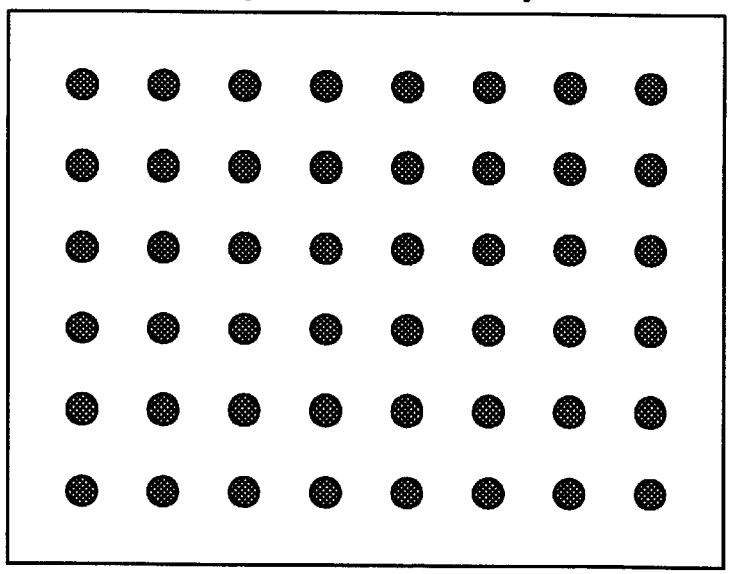
FIG. 1 is a schematic view showing a ball array on a package of conventional 1M, 2M or 4M SRAM device.
Figure 2A:
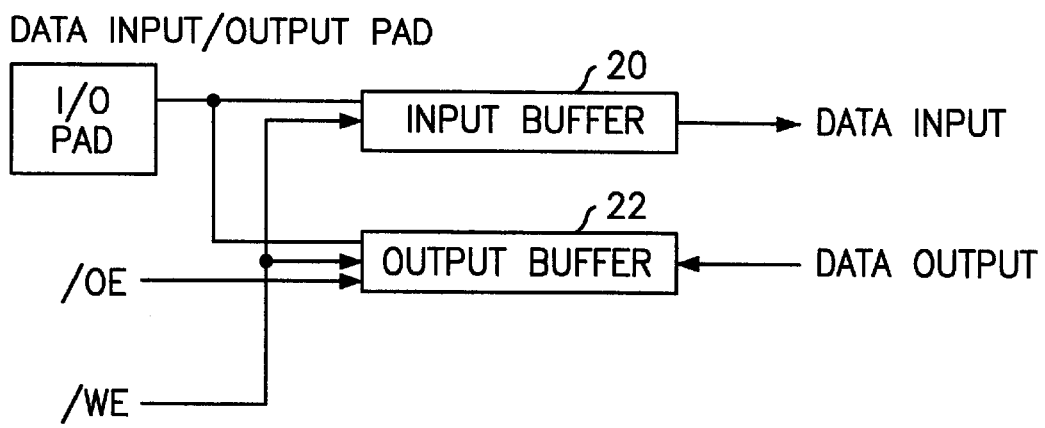
FIG. 2a is a block diagram illustrating data input/output pad and address pad in the conventional SRAM.
Figure 2A:
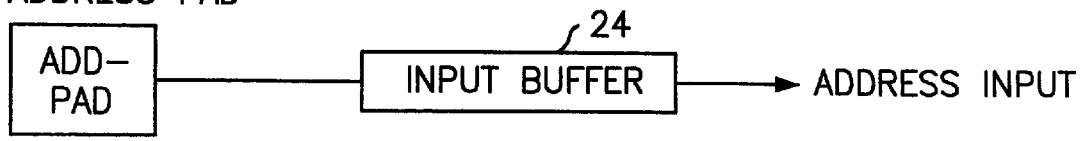
Figure 2B:
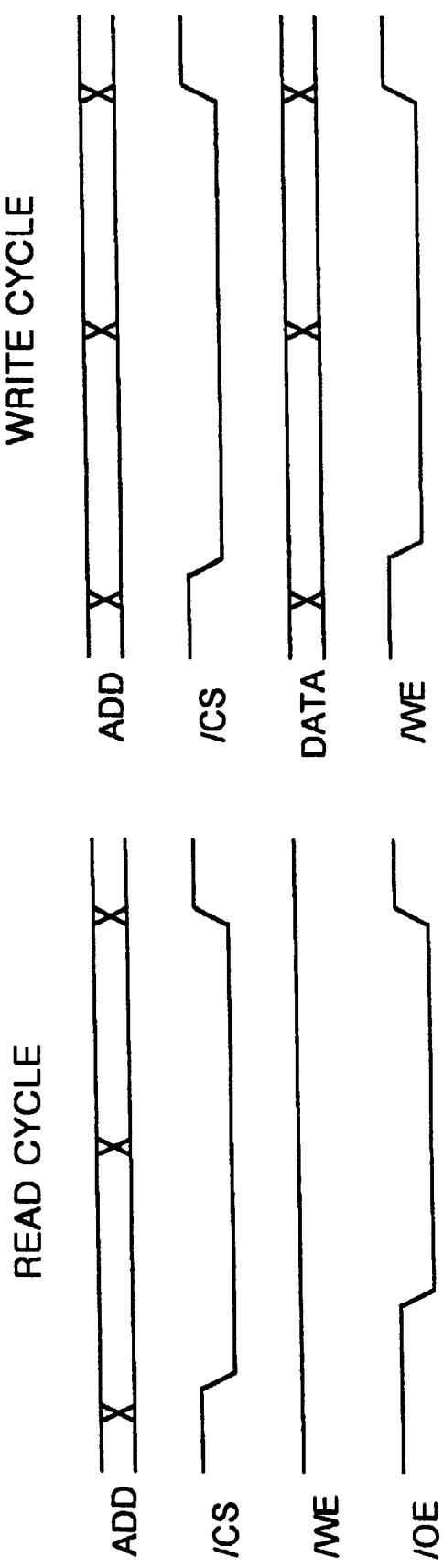
Figure 2C:
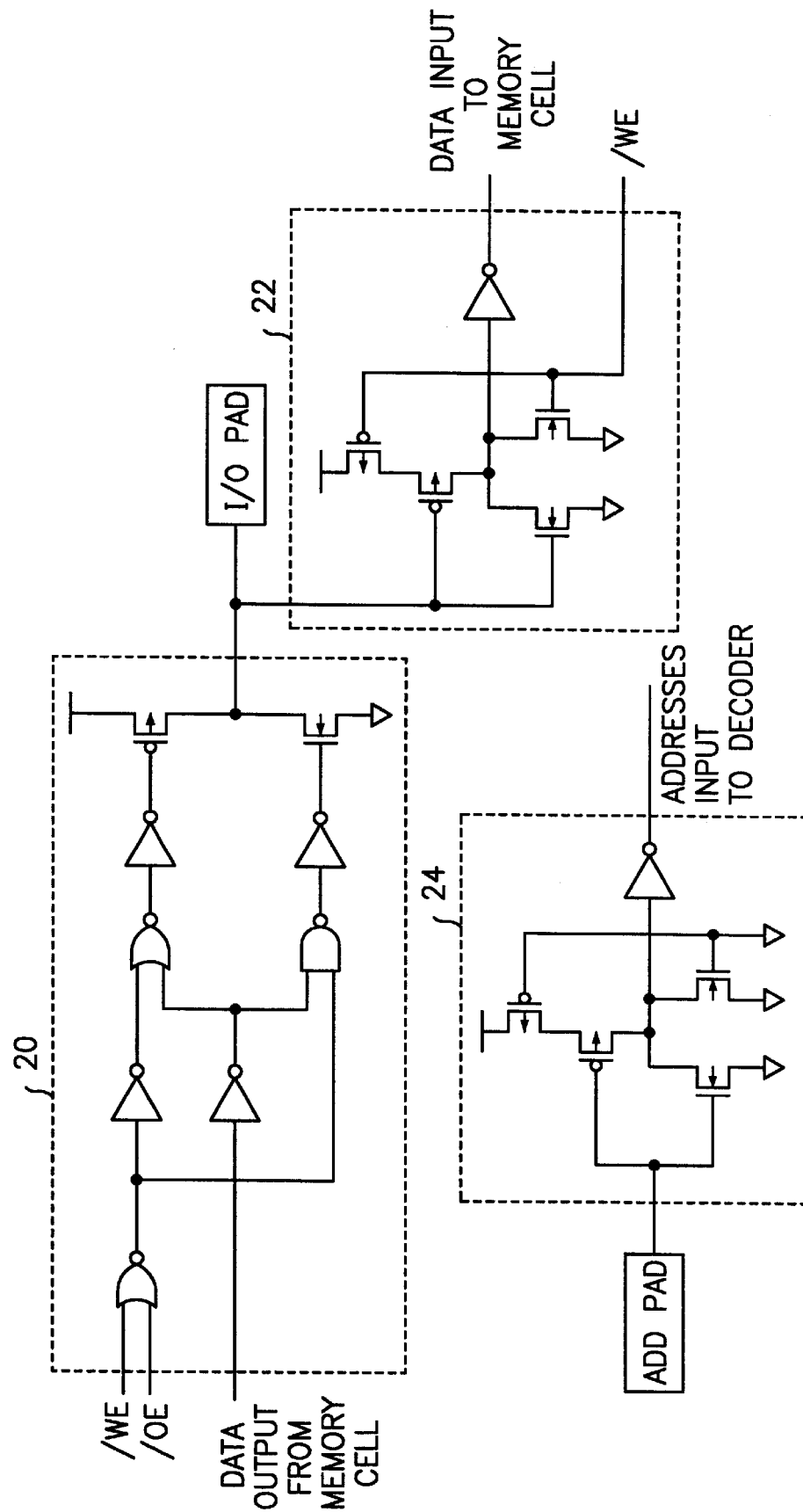

First, referring to FIG. 3a, input and output data and address signals are transmitted between an external circuit and an internal memory through a common pad (hereinafter, referred to as a multi-pad). As compared with the conventional semiconductor device as shown in FIG. 2a, the present invention needs an additional control signal (hereinafter, referred to as an address enable signal /AE) for discriminating between data signals and address signals on the multi-pad. When the address enable signal /AE from an external controller is in a low level, the signals, which are inputted into the multi-pad, are the address signals. On the contrary, when the address enable signal /AE from a memory controller is in a high level, the signals, which are inputted into the multi-pad, are the data signals. Also, since the input data and the address signals are inputted into a common input buffer 32, these signals are multiplexed by the address enable signal /AE. The input data from the common input buffer 32 are inputted into a data input part 36 and the address signals therefrom are inputted into an address input part 34.

Data read and write operations are determined by write and read enable signals /WE and /OE. The read data from the memory cells are buffered in the output buffer 30 in response to the address enable signal /AE and the write and read enable signals /WE and /OE and then, they are outputted to the multi-pad. In addition, each of the address input part 34 and data input part 36 includes a switching device for selectively transferring the signals from the common input buffer 32 to a latch circuit in response to the address enable signal /AE. The switching device will be described in detail referring to FIG. 3c.

Figure 4:
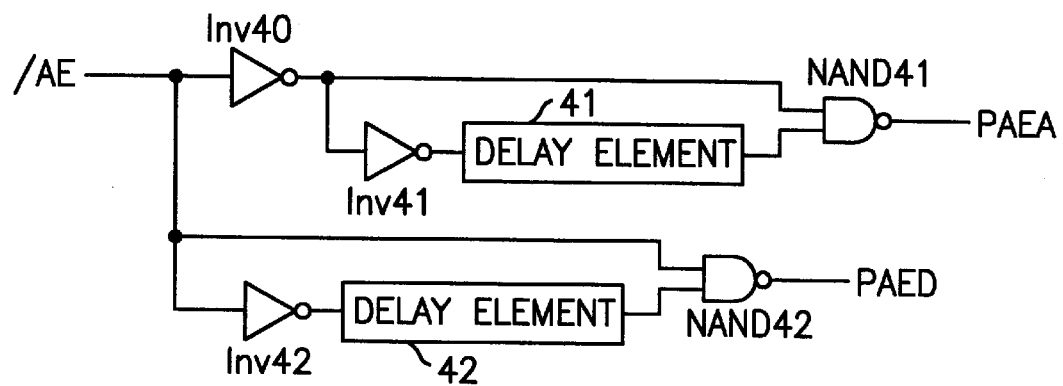
FIG. 4 is a bock diagram illustrating pulse signals produced by an address enable signal in accordance with the present invention.

Referring to FIG. 4, the address enable signal /AE is divided into first and second pulse signals PAEA and PAED by inverters inv40 to inv42, delay elements 41 and 42 and NAND gates NAND41 and NAND42. The inverter inv40 inverts the address enable signal /AE, the inverter inv41 inverts the output from the inverter inv40, and the output from the inverter inv41 is delayed in the delay element 41. The NAND gates NAND41 produces the first pulse signal PAEA by NANDing the outputs from the inverter inv40 and the delay element 41. Also, the inverter inv42 inverts the address enable signal /AE, and the output from the inverter inv42 is delayed in the delay element 42. The NAND gates NAND42 produces the second pulse signal PAED by NANDing the address enable signal /AE and the output from the delay element 42.

Referring again to FIGS. 3a and 3b, the first pulse signal PAEA is an internal pulse generated when the address enable signal /AE is going from a high logic state to a low logic state, and also the second pulse signal PAED is another internal pulse generated when the address enable signal /AE is going from a low logic state to a high logic state. The address signals are inputted into the common input buffer 32 at the time the first pulse signal PAEA is going from a high logic state to a low logic state and the read and write data are respectively inputted into the output buffer 30 and the common input buffer 32 in response to the write and read enable signals /WE and /OE at the time the second pulse signal PAED is going from a high logic state to a low logic state. In the case where the write enable signal /WE is in a high level and the read enable signal /OE is in a low level, the data from memory cells are buffered in the output buffer 30. Also, in the case where the write enable signal /WE is in a low level, the data from an external circuit are buffered in the common output buffer 32 regardless of the state of the read enable signal /OE.

On the other hand, two kinds of signals (i.e., write data and address signals) are buffered in the common input buffer 32. If the signals are address signals, such address signals are latched in the address input part 34 under the control of the address enable signal /AE. If the signals are the input data, such data are latched in the data input part 36 under the control of the address enable signal /AE.

Figure 3A:
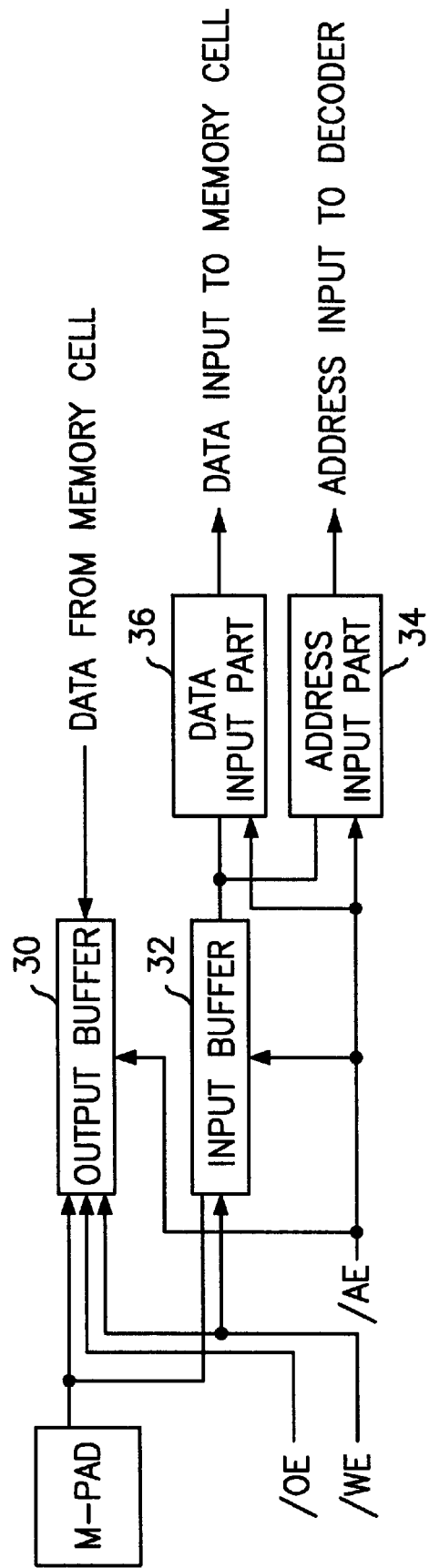
FIG. 3a is a block diagram illustrating a semiconductor memory device in accordance with the present invention.
Figure 3B:
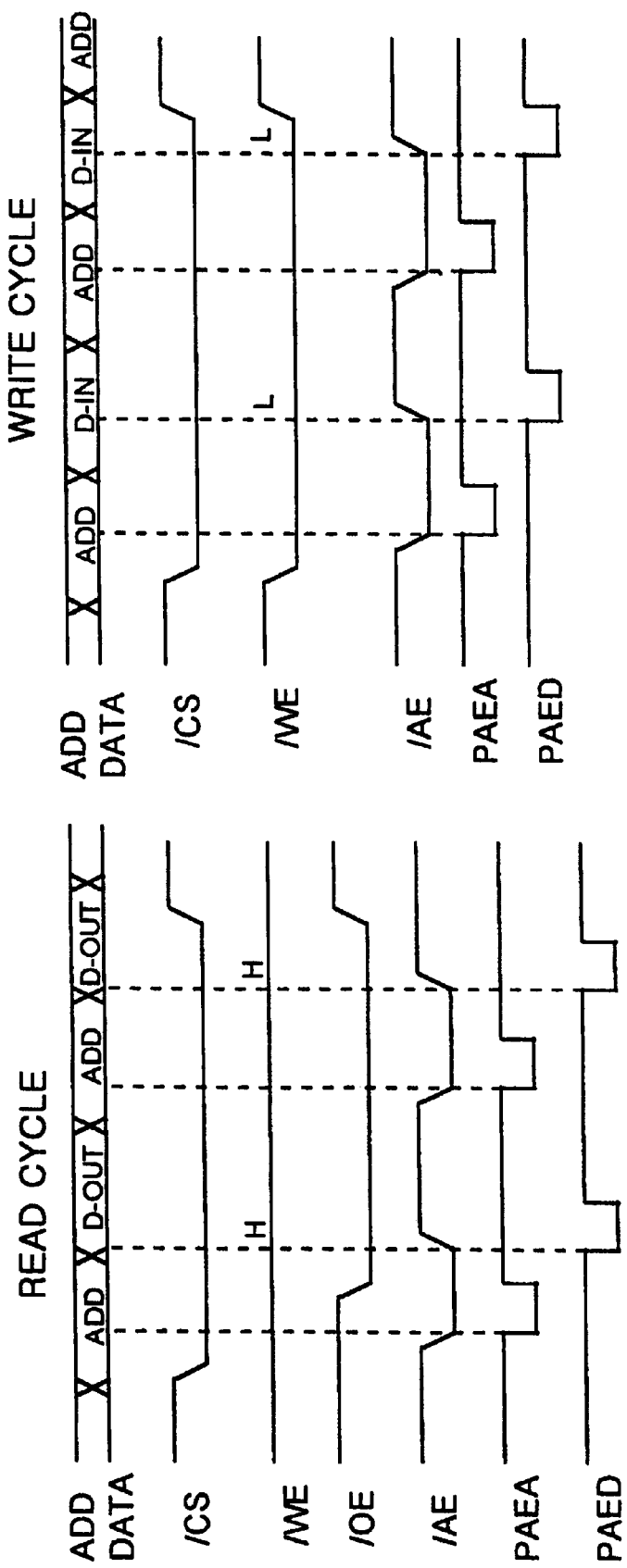
Figure 3C:
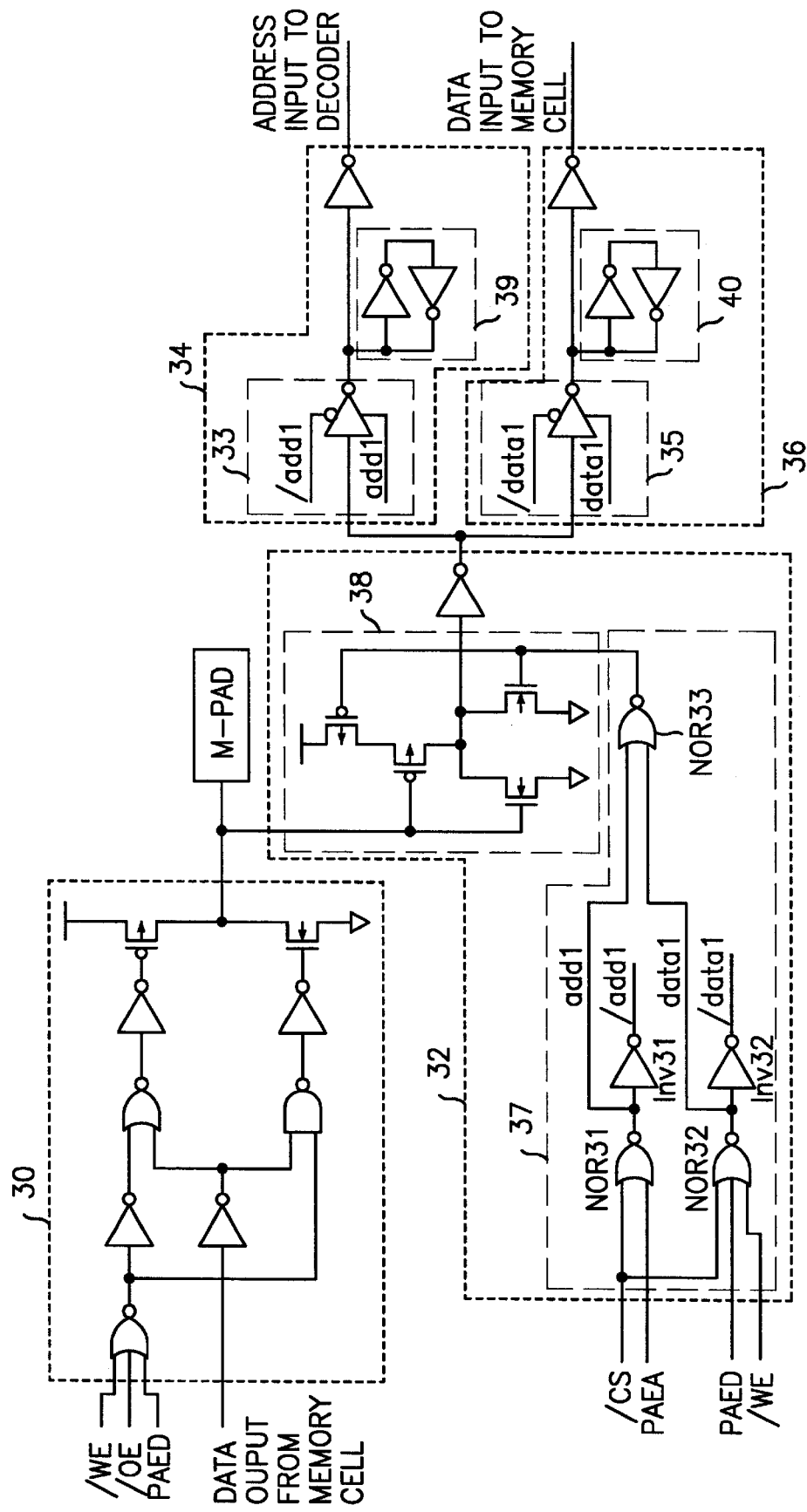

FIG. 3c is a block diagram illustrating detailed configuration of input and output buffers in FIG. 3a. As shown in FIG. 3c, the output buffer 30 is controlled by a NOR gate which receives the write and read enable signals /WE and /OE and the second pulse signal PAED. The output from the NOR gate and the output data (or read data) are combined in various logic gates, which selectively turn on and off a pull-up device and a pull-down device in the type of CMOS inverter. The input buffer 32 includes a control part 37 and a signal transferring unit 38, which has pull-up and pull-down devices to selectively transfer the signals (input data and address). The control part 37 produces a control signal for controlling the signal transferring unit 38 and the control signal generated by the control part 37 selectively transfers the signals from the multi-pad to the address input part 34 or the data address input part 36.

The control part 37 includes a first NOR gate NOR31 receiving a chip enable signal /CS and the first pulse signal PAEA and a second NOR gate NOR32 receiving the write enable signal /WE and the second pulse signal PAED. The outputs from the first and second NOR gates NOR31 and NOR32 are inputted into a third NOR gates NOR33 and then, the output from the third NOR gate NOR33 controls the pull-up and pull-down devices in the signal transferring unit 38.

As stated above, since two kinds of signals, such as input data and address signals, are buffered in the common input buffer 32, a switching device is provided for each of the address input part 34 and data input part 36. A first switching device 33 in the address input part 34 transfers the address signals to a first latch circuit 39 in response to control signals add1 and/add1 from the NOR gate NOR31 in the control part 37. If the signals on the multi-pad are the input data, a second switching device 35 in the data input part 36 transfers the input data to a second latch circuit 40 in response to control signals data1 and/data1 from the NOR gate NOR32 in the control part 37.

Figure 5:
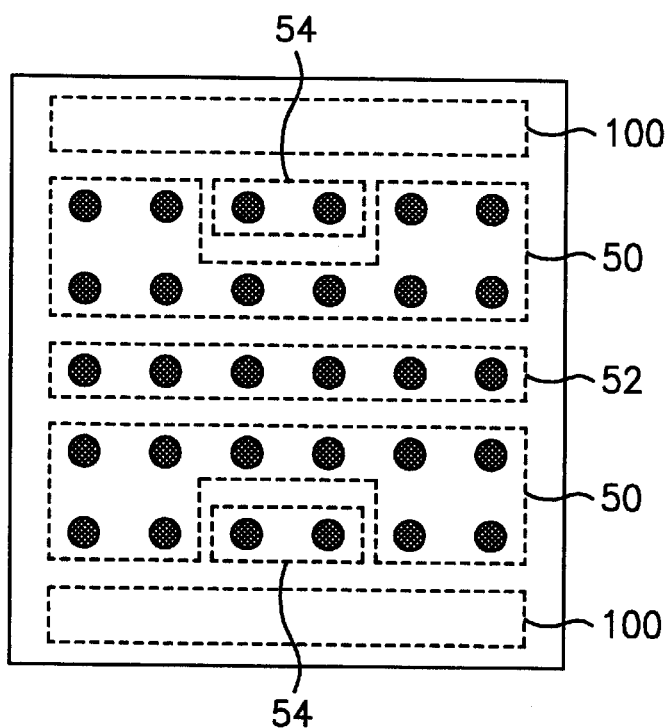
FIG. 5 is a schematic view showing a ball array and a chip pad on a package of SRAM in accordance with the present invention.

In the case where the present invention is applied to the CSP of SRAM, the packaging of 16M SRAM can be carried out only by 30 balls, as shown in FIG. 5. That is, in the case of 1M SRAM, 26 balls for 16 multi-pads, 6 control pads and 4 power source pads are needed and, in the case of 1M, 4M and 16M SRAM, 28, 29 and 30 balls are needed, respectively. Therefore, as compared with the CSP (6×8=48 balls) based on the conventional SRAM, the package area in accordance with the present invention may be remarkably reduced. Furthermore, the design margin may be obtained in the ball array. In the conventional CSP having 48 balls, when the chip pads are respectively located on the two opposite sides, it is impossible to connect all balls to the chip pad if three wires don't run between the balls (if two wires run between the balls, 4 balls are not connected to the chip pad). However, the present invention makes it possible to connect all balls to the chip pad using only two wires, which run between the balls.

Referring to FIG. 5, the CSP of 16M SRAM in accordance with the present invention has 30 balls. In FIG. 5, reference numeral 100 denotes a chip pad area, 50 a data and address input/output ball area, 52 a control ball area, and 54 a power source ball area, respectively. In accordance with the present invention, a 16-bit memory may need an upper 8-bit enable signal /UB and a lower 8-bit enable signal /LB for data and address in addition to the above-mentioned control signals /OE, /WE, CS and /AE. If the present invention is applied to 1M, 2M, 4M and 8M SRAM having 20 balls for data and addresses I/O terminals, they may have 4 spare balls, 3 spare balls, 2 spare balls and 1 spare ball, respectively.

The present invention may be available to other semiconductor devices such as DRAM and SDRAM. In particular, the present invention is also available to all the devices having data input and output pins. As apparent from the above, the present invention has an effect on the reduction of the package size by applying an additional control signal to the input data and address signals transfer path.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A signal processing device receiving signals from an external circuit and outputting processed signals to the external circuit, the signal processing device comprising:
   at least one common signal input means for receiving more than two kinds of signals;
   a plurality of signal paths connected to the common signal input means;
   a control means for controlling the signal paths in response to a plurality of control signals from the external circuit;
   the external circuit comprising a controller for controlling the signal processing device and the control signals comprising a first control signal for inputting the signals, a second control signal for outputting the processed signals and a third control signal for controlling the signal paths;
   the signal processing device comprising a plurality of buffer means on each signal path so that each signal on the signal paths is buffered in the buffer means in response to the control signals;
   the signal processing device further comprising a plurality of latch circuits, wherein the buffer means are selectively connected to the latch circuits through a plurality of switching means; and
   the switching means being controlled by pulse signals which is produced by the third control signal.

2. A semiconductor memory device comprising:
   at least one common signal input terminal for receiving data signals and address signals;
   a first input terminal for receiving a read-enable signal;
   a second input terminal for receiving a write enable signal;
   a third input terminal for receiving a first control signal to control a signal transferring path according to kinds of signals on the common signal input terminal, wherein the signals on the common signal input terminal are the data signals or the address signals;
   a data input means coupled to the common signal input terminal for inputting the data signals to memory cells in response to the write enable signal and the first control signal;
   an address input means coupled to the common signal input terminal for inputting the address signals to a decoding means in response to the write enable signal and the first control signal; and
   a pulse generating means for generating first and second pulse signals, wherein the first pulse signal is going from a high logic state to a low logic state at a falling edge of the first control signal, and the second pulse signal is going from a high logic state to a low logic state at a arising edge of the first control signal, the pulse generating means comprising:
   a first inverting means for inverting the first control signal;
   a second inverting means for inverting an output from the first inverting means;
   a first delay means for delaying an output from the second inverting means;
   a first logic gate for NANDing an output from the first inverting means and an output from the first delay means for producing the first pulse signal;
   a third inverting means for inverting the first control signal;
   a second delay means for delaying an output from the third inverting means; and
   a second logic gate for NANDing an output from the third inverting means and an output from the second delay means for producing the second pulse signal.

3. The semiconductor memory device in accordance with claim 2, wherein the common signal input terminal receives the data signals from an external circuit and the memory cells.

4. The semiconductor memory device in accordance with claim 2, wherein the semiconductor memory device further comprises a data output means coupled to the common signal input terminal for outputting the data signals from the memory cells in response to the write enable signal, the read enable signal and the first control signal.

5. The semiconductor memory device in accordance with claim 4, wherein the data output means further comprises an output buffer.

6. The semiconductor memory device in accordance with claim 2, wherein the data input means comprises:

a first input buffer coupled to the common signal input terminal for buffering the data signals in response to the write enable signal and the first control signal; and a first latch means for latching the data signals from the first input buffer in response to the write enable signal and a second control signal.

7. The semiconductor memory device in accordance with claim 6, wherein the address input means comprises:

a second input buffer coupled to the common signal input terminal for buffering the address signals in response to the write enable signal and the first control signal; and a second latch means for latching the address signals from the second input buffer in response to the write enable signal and a third control signal.

8. The semiconductor memory device in accordance with claim 7, wherein the data input means comprises a switching means for selectively transferring the data signals from the first input buffer to the first latch means.

9. The semiconductor memory device in accordance with claim 8, wherein the address input means comprises a switching means for selectively transferring the address signals from the second input buffer to the second latch means.

10. The semiconductor memory device in accordance with claim 9, wherein the second control signal is produced by the first pulse signal and a chip enable signal from a memory controller and the third control signal is produced by the second pulse signal and the write enable signal.

11. A semiconductor memory circuit comprising:

at least one common signal input terminal for receiving data signals and address signals, wherein the common signal input terminal is coupled to a plurality of signal paths; and a signal path selecting means for selecting one of the plurality of signal paths in response to a write enable signal, a read enable signal and a control signal from a memory controller, wherein the signal path selecting means comprises a plurality of buffers on the signal paths and wherein the signal path selecting mean selects one of the buffers in response to a write enable signal, a read enable and a control signal from a memory controller;

each of the plurality of buffers further comprises a plurality of latch circuits; and latched signals are selected by a chip enable signal, the write enable signal and the control signal from a memory controller.

* * * * *